(12) United States Patent
Wu et al.

(10) Patent No.: US 8,878,157 B2
(45) Date of Patent: Nov. 4, 2014

(54) SEMICONDUCTOR-GRAPHENE HYBRIDS FORMED USING SOLUTION GROWTH

(71) Applicant: University of Kansas, Lawrence, KS (US)

(72) Inventors: Judy Wu, Lawrence, KS (US); Jianwei Liu, Manhattan, KS (US)

(73) Assignee: University of Kansas, Lawrence, KS (US)

( * ) Notice: Subject to any disclaimer, the term of this patent is extended or adjusted under 35 U.S.C. 154(b) by 1 day.

(21) Appl. No.: 13/655,656

(22) Filed: Oct. 19, 2012

(65) Prior Publication Data

US 2013/0099196 A1  Apr. 25, 2013

Related U.S. Application Data

(60) Provisional application No. 61/549,464, filed on Oct. 20, 2011.

(51) Int. Cl.

| | |
|---|---|
| *H01L 29/16* | (2006.01) |
| *H01L 21/02* | (2006.01) |
| *H01L 29/06* | (2006.01) |
| *H01L 33/18* | (2010.01) |
| *B82Y 40/00* | (2011.01) |
| *H01L 33/00* | (2010.01) |
| *B82Y 30/00* | (2011.01) |

(52) U.S. Cl.
CPC ...... *H01L 21/02376* (2013.01); *H01L 29/1606* (2013.01); *H01L 33/18* (2013.01); *H01L 21/02658* (2013.01); *H01L 21/02425* (2013.01); *H01L 21/02603* (2013.01); *B82Y 40/00* (2013.01); *H01L 29/0676* (2013.01); *H01L 33/0087* (2013.01); *H01L 21/02527* (2013.01); *H01L 21/02628* (2013.01); *B82Y 30/00* (2013.01); *H01L 21/02554* (2013.01)
USPC .............................................................. 257/9

(58) Field of Classification Search
CPC ......................... H01L 29/0665; H01L 29/0673
USPC ........................................ 257/9; 438/104, 666
See application file for complete search history.

(56) References Cited

U.S. PATENT DOCUMENTS

| | | | |
|---|---|---|---|
| 6,833,558 B2 | 12/2004 | Lee et al. | |
| 6,960,425 B2 | 11/2005 | Jung et al. | |

(Continued)

OTHER PUBLICATIONS

Kim et al., Hydrothermally grown ZnO nanostructures on few-layer graphene, Apr. 2011, Nanotechnology, 22, 245603, pp. 1-8.*

(Continued)

*Primary Examiner* — Matthew W Such
*Assistant Examiner* — Warren H Kilpatrick
(74) *Attorney, Agent, or Firm* — Bell & Manning, LLC

(57) ABSTRACT

A novel method for fabrication of hybrid semiconductor-graphene nanostructures in large scale by floating graphene sheets on the surface of a solution is provided. Using this approach, crystalline ZnO nano/micro-rod bundles on graphene fabricated using chemical vapor deposition were prepared. UV detectors fabricated using the as-prepared hybrid ZnO-graphene nano-structure with graphene being one of the two electrodes show high sensitivity to ultraviolet light, suggesting the graphene remained intact during the ZnO growth. This growth process provides a low-cost and robust scheme for large-scale fabrication of semiconductor nanostructures on graphene and may be applied for synthesis of a variety of hybrid semiconductor-graphene nano-structures demanded for optoelectronic applications including photovoltaics, photodetection, and photocatalysis.

24 Claims, 8 Drawing Sheets

(56) References Cited

U.S. PATENT DOCUMENTS

| | | | |
|---|---|---|---|
| 7,374,793 B2 | 5/2008 | Furukawa et al. | |
| 8,043,596 B2 | 10/2011 | Soga et al. | |
| 8,075,863 B2 | 12/2011 | Hart et al. | |
| 2008/0247938 A1 | 10/2008 | Tsai et al. | |
| 2010/0081057 A1* | 4/2010 | Liu et al. | 429/231.5 |
| 2010/0129549 A1 | 5/2010 | Chan et al. | |
| 2010/0278720 A1* | 11/2010 | Wong et al. | 423/604 |
| 2011/0101365 A1 | 5/2011 | Kim et al. | |
| 2012/0107221 A1 | 5/2012 | Bai | |
| 2013/0048339 A1* | 2/2013 | Tour et al. | 174/126.1 |

OTHER PUBLICATIONS

Kim et al., *Large-scale pattern growth of graphene films for stretchable transparent electrodes*, Nature 457 706-710 (2009).

Kim et al., *Vertically aligned ZnO nanostructures grown on graphene layers*, Appl Phys Lett 95 213101 (2009).

Lee et al., *ZnO Nanorod-Graphene Hybrid Architectures for Multifunctional Conductors*, J Phys Chem 113 19134-19138 (2009).

Bae et al., *Roll-to-roll production of 30-inch graphene films for transparent electrodes*, Nature Nanotechnology 5 574-578 (2010).

Chen et al., *Energy Transfer from Individual Semiconductor Nanocrystals to Graphene*, ACS Nano 4(5) 2964-2968 (2010).

Das et al., *ZnO single nanowire-based UV detectors*, Applied Physics Lett 97 022103 (2010).

Liu et al., *Aligned, Ultralong Single-Walled Carbon Nanotubes: From Synthesis, Sorting, to Electronic Devices*, Adv Mater 22 1-26 (2010).

Peng et al., *Effect of the Reynolds and Richardson Numbers on the Growth of Well-Aligned Ultralong Single-Walled Carbon Nanotubes*, J Phys Chem C 114 (12960-12965 (2010).

\* cited by examiner

SEMICONDUCTOR-GRAPHENE HYBRIDS FORMED USING SOLUTION GROWTH

CROSS-REFERENCE TO RELATED APPLICATIONS

This application is based on and claims priority to U.S. Provisional Application Ser. No. 61/549,464, filed on Oct. 20, 2011, which is incorporated herein by reference in its entirety.

STATEMENT REGARDING FEDERALLY SPONSORED RESEARCH OR DEVELOPMENT

The present invention was sponsored by the U.S. Army Research Office Contract No. ARO-W911NF-09-1-0295 and W911NF-12-1-0412, and National Science Foundation Contracts Nos. NSF-DMR-0803149, 1105986, and EPSCoR-0903806, and the government may have certain rights in the invention.

BACKGROUND OF THE INVENTION

Graphene, a one-atom-thick planer sheet of $sp^2$ bonded carbon atoms, holds promise for optoelectronic applications due to its unique properties of high carrier mobility at room temperature, with reported values in excess of 15,000 $cm^2V^{-1}s^{-1}$, optical transmittance of about 97.9% for white light and flexibility (see Novoselov et al. (2005); Geim et al. (2007); and Novoselov et al. (2004)). However, the zero bandgap of the graphene has presented a major hurdle to its electronic applications, especially in digital electronics. While small sub-eV bandgaps have been obtained in graphene nanoribbon ("GNRs") or graphene nanomesh (see Han et al. (2007); Bai et al. (2010); and Todd et al. (2009)), it is often at the cost of significantly reduced mobility due to the presence of charge fluctuation associated with various defects primarily from the uncontrolled GNR edges and the interfaces. In the meantime, considerable efforts have been made recently to attach photosensitive materials to graphene to form hybrid structures with selected ranges of photoabsorption (see Kamat (2011)). For example, a $TiO_2$/GO hybrid was synthesized using hydrolysis in combination with hydrothermal treatment as a photocatalyst for photodegradation of rhodamine B molecules (see Liang et al. (2010)). On the other hand, CdSe/ZnS core/shell nanocrystals were spun-coat onto the graphene layers of mechanical exfoliated flakes, for efficient energy transfer from photo-excited CdSe/ZnS nanocrystals to graphene with fluorescence intensity quenched by a factor of about 70 (see Chen et al. (2010)). The hybrid structure of ZnO/graphene is of particular interest because of its superior wavelength selectivity and charge mobility, both are critical to applications of ultraviolet ("UV") sensors (see Chang et al. (2011)), electron emitters (see Kim et al. (2011)), and many other applications (see Hwang et al. (2010) and Chung et al. (2010)). Interesting progress has been made in fabrication of hybrid nanostructures of ZnO/graphene including chemical vapor deposition ("CVD") of ZnO nanowires and nanowalls on CVD graphene (see Kumar et al. (2011)), solution synthesis of ZnO nanorods on graphene flakes casted on silicon or glass substrates to form hybrid ZnO/graphene thin films (see Chang et al. (2011)), and solution synthesis of ZnO nanorods on CVD graphene transferred on glass or poly(ethylene terephthalate) substrates (see Park et al. (2009)). The required high temperature in the CVD growth of ZnO nanostructure on graphene is not preferred since it will prevent use of many technologically important substrates such as glass and plastic (see Kumar et al. (2011)). In addition, the high ZnO growth temperature may lead to formation of defects on graphene and hence degrade the conductivity of graphene and possibly the interface between graphene and ZnO, both are crucial to optoelectronic applications. The solution method (see Vayssieres (2003); Xu et al. (2008); and Yang et al. (2006)) has a unique advantage for the large-scale synthesis of hybrid nanostructures of ZnO/graphene at low temperatures and low costs. However, the reported solution process requires ZnO seeding layers to initiate nucleation of ZnO on graphene. Generation of the seeding layer involves additional fabrication and lithography steps in vacuum and at elevated temperatures up to 180° C. (see Park et al. (2009) and Yi et al. (2011)). Furthermore, it should also be noted that aligned ZnO nanowire array directly grown on graphene possesses advantages of optimized UV absorption and superior photo-carrier transfer/transport, both are crucial to high-performance UV detectors. Unfortunately, such a configuration of vertically aligned ZnO nanowire arrays has not been obtained in solution processes, in which the samples are typically immersed in the solution in a face-up configuration (see Zhou et al. (2012) and Yang et al. (2011)).

BRIEF SUMMARY OF THE INVENTION

The present invention is directed to a seedless method for forming a semiconductor-graphene hybrid. The method includes the steps of forming a graphene sheet on a support to form a supported graphene sheet having a graphene face; exposing the supported graphene sheet to a solution comprising a semiconductor metal ion at a temperature below 100° C. for a time so that the semiconductor grows on the graphene sheet. The solution growth occurs without seeding the graphene sheet. The exposing step may occur by orienting the supported graphene sheet face-up in the solution or face-down in the solution. In a preferred aspect, the exposing step comprises floating the supported graphene sheet such that the graphene face is facing down.

In one aspect, the semiconductor grown on the graphene sheet comprises a metal oxide, preferably zinc oxide or copper oxide. In another aspect, the semiconductor forms nanostructures or microstructures comprising rod-like or wire-like structures on the graphene sheet. The rods/wires may be generally horizontally aligned on the graphene sheet (typically in the case of face-up solution growth) or generally vertically aligned on graphene sheet (typically in the case of face-down solution growth). In a further aspect, the rods/wires have a hexagonal cross section. In yet another aspect, the semiconductor-graphene hybrid comprises graphene having zinc oxide nanorods and/or microrods.

In still another aspect, the solution for the solution growth is an aqueous basic solution, preferably having a pH of about 8 to 11 (e.g., a pH of about 8, 9, 10, 11, or 12). In another aspect, the graphene sheet is exposed to the solution for about 1 to 15 hours. In yet another aspect, the graphene sheet is exposed to the solution at temperatures of about 60 to 100° C.

It will be appreciated that the present invention is directed to a novel seedless growth scheme for solution synthesis of micro/nanostructures made of functional materials, such as semiconductors, on graphene. For example, graphene sheets may be prepared in large dimension using CVD and may be supported on flexible substrates, such as polymer-based substrates. The seedless growth process of the present invention is then used to deposit the functional materials (e.g., the semiconductor) on the graphene. In the exemplary embodiment, ZnO nanostructures were deposited on CVD graphene supported by polymethylmethacrylate ("PMMA").

In one aspect, the growth methods of the present invention may prevent or at least minimize contamination caused by accumulation of impurity and reaction residues during solution growth.

In another aspect, the methods of the present invention do not require seeds which is in contrast to other methods that require a seed layer for functional materials (such as ZnO) to nucleate.

In another aspect, the growth methods of the present invention provide for a well formed interface between the graphene sheet and micro/nanostructures of the functional materials.

The development of such semiconductor-graphene hybrid micro/nanostructure systems using the solution growth methods of the present invention offer several advantages. Advantages of the hybrid system include, but are not limited to, high mobility and hence high electrical conductivity of charge carriers (due to graphene), extremely thin electrode (graphene may be one layer of carbon atoms), flexibility (if the graphene is supported by flexible support), low cost, and scalability to large scale. For example, the UV detectors fabricated using the exemplary hybrid ZnO-graphene micro/nanostructures with graphene being at least one of the two electrodes show a fast response and high sensitivity to ultraviolet light, suggesting the graphene maintained intact during the ZnO growth.

The growth process of the present invention provides a low-cost and robust scheme for large-scale fabrication of semiconductor (or functional materials in general) micro/nanostructures on graphene. The process may be applied for synthesis of a large variety of hybrid semiconductor-graphene micro/nanostructures, including those for optoelectronic applications including photovoltaics, photodetection, and photocatalysis.

Additional aspects of the invention, together with the advantages and novel features appurtenant thereto, will be set forth in part in the description which follows, and in part will become apparent to those skilled in the art upon examination of the following, or may be learned from the practice of the invention. The objects and advantages of the invention may be realized and attained by means of the instrumentalities and combinations particularly pointed out in the appended claims.

BRIEF DESCRIPTION OF THE DRAWINGS

FIG. 1 shows the seedless facing-up in solution and facing-down floating growth of ZnO nanowires/rods on the graphene film. The graphene sheet is supported by PMMA and placed facing-down or facing-up during the ZnO growth in solution.

FIG. 7D shows the transmission optical spectra of graphene (curve with diamonds), ZnO grown on graphene for 3 hours (curve with cubes) and 12 hours (curve with circles) by facing-down floating, and for 3 hours (curve with triangles ▲), and 12 hours (curve with triangles ▼) by facing-up in solution.

FIG. 8 (panel b) is the energy diagram for the device with work function values for the FTO and graphene, and conduction and valence band edges for ZnO. FIG. 8 (panel c) shows the I-V characteristic curves of aligned ZnO micro/nanowires grown on graphene in the dark (black curve) and with UV illumination at 18 mW/cm$^2$ (curve with cubes), at 20 mW/cm$^2$ (curve with triangles ▲), at 22 mW/cm$^2$ (curve with triangles ▼), respectively. FIG. 8 (panel d) is the photoresponsivity vs. bias voltage at the UV light intensity of 18 mW/cm$^2$.

DETAILED DESCRIPTION OF PREFERRED EMBODIMENT

Figure 1:
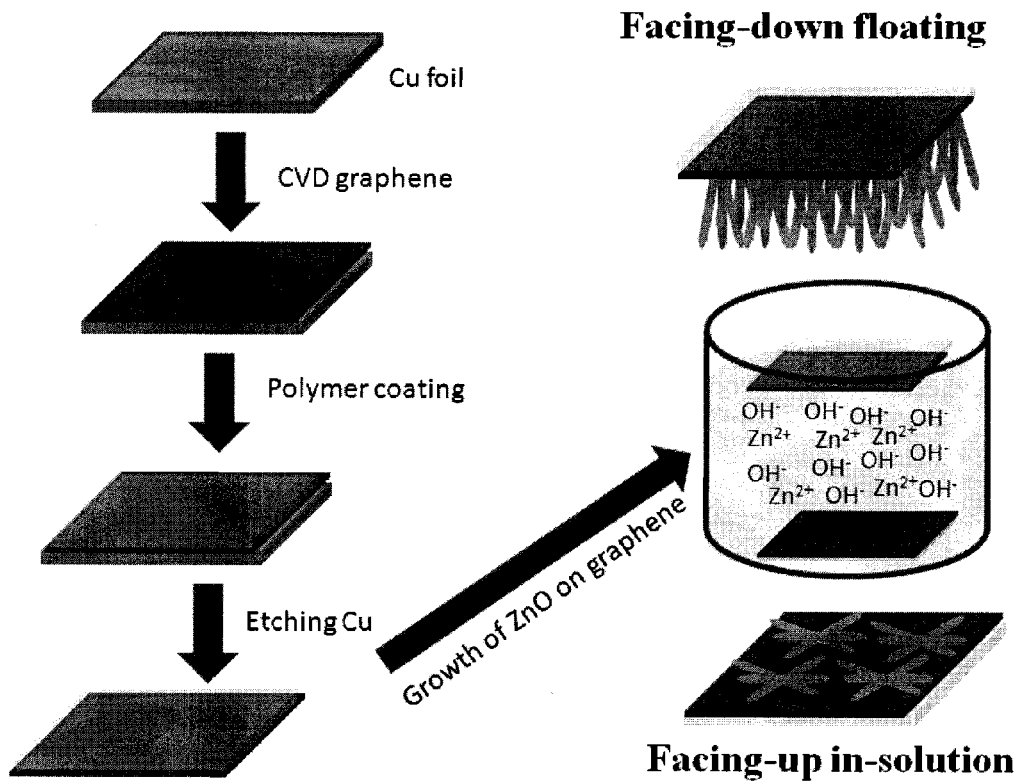
FIG. 1 is a schematic showing seedless growth of a semiconductor-graphene hybrid in an exemplary embodiment in accordance with the present invention. The graphene sheet is made using CVD in the example.

The present invention is directed to a novel seedless growth scheme for solution synthesis of micro/nanostructures comprised of functional materials, such as semiconductors, on graphene. In general, the methods described herein are particularly useful for the formation of semiconductor-graphene hybrid micro/nanostructures. The method includes the steps of forming a graphene sheet on a support to form a supported graphene sheet having a graphene face. The graphene sheet is then exposed to a solution comprising the functional material (e.g., the semiconductor metal ions) at low temperatures, typically below about 100° C., for a time so that the semiconductor grows on the graphene sheet.

The present invention includes seedless growth schemes in which the graphene may be oriented either face-up or face-down in the solution. It is also contemplated that the graphene sheet may be oriented both horizontally, vertically, or at some other angle in the solution. In one aspect, the graphene sheet may be oriented face-down in the solution at an angle of 0, 5, 10, 15, 20, 25, 30, 35, 40, 45, 50, 55, 60, 65, 70, 75, 70, 85, or 90 degrees relative to horizontal. In another aspect, the graphene sheet may oriented face-up in the solution at an angle of 0, 5, 10, 15, 20, 25, 30, 35, 40, 45, 50, 55, 60, 65, 70, 75, 70, 85, or 90 degrees relative to horizontal. In addition, orientation of the graphene sheet may be changed throughout the growth process. For example, the graphene sheet may be oriented in a first configuration (e.g., face-down) for a first period of time (e.g., 1, 2, 3, 4, 5, 6, 7, 8, 9, 10, 11, or 12 hours) and then oriented in a second configuration (e.g., face-up) for a second period of time (e.g., 1, 2, 3, 4, 5, 6, 7, 8, 9, 10, 11, or 12 hours).

In an exemplary aspect, the method includes the steps of forming a graphene sheet on a support to form a supported graphene sheet having a graphene face and then floating the supported graphene sheet in a solution having a material comprising the functional material (e.g., semiconductor metal ions). The graphene face is facing down so that the semiconductor grows on the graphene sheet.

The graphene sheet may be prepared by any suitable preparation method, such as mechanical exfoliation, chemical exfoliation, heat treatment of SiC, CVD, epitaxial synthesis, or organic synthesis. The graphene sheet is typically grown using CVD. In an exemplary embodiment, graphene is grown on a substrate (e.g., copper or nickel) using CVD. The graphene sheets have surface defects or are otherwise functionalized, for example by attaching a hydroxyl (—OH) moiety, which permit the attachment of the semiconductor material to the graphene sheet. For example, while graphene may be generally described as a one-atom-thick planar sheet densely packed in a honeycomb crystal lattice, these sheets are typically produced as part of an amalgamation of materials, often including materials with defects in the crystal lattice. For example, pentagonal and heptagonal cells constitute defects. If an isolated pentagonal cell is present, then the plane generally warps into a cone shape. Likewise, an isolated heptagon generally causes the sheet to become saddle-shaped. When producing graphene by known methods, these and other defects are typically present. Further, in one aspect, at least a portion of the graphene is not reduced, and the resultant material contains at least some graphene oxide. As used herein, the term "graphene" should be understood to encompass materials such as these, that contain both graphene and small amounts of graphene oxide. For example, functionalized graphene sheets (FGSs) prepared through the thermal expansion of graphite oxide as shown in McAllister et al. A. Single Sheet Functionalized Graphene by Oxidation and Thermal Expansion of Graphite. Chem. Mater. 19 4396-4404 (2007) and Schniepp et al., *Functionalized Single Graphene Sheets Derived from Splitting Graphite Oxide*, J. Phys. Chem. B 110 8535-8539 (2006) and have been shown to have tunable C/O ratios ranging from 10 to 500. The term "graphene" as used herein should be understood to include both pure graphene and graphene with small amounts of graphene oxide, as is the case with these materials.

The graphene sheet is also supported with a suitable support, which is preferably a flexible support. In an exemplary aspect, after the CVD of the graphene onto the copper substrate, a polymethylmethacrylate ("PMMA") support is then spin-coated on the graphene sheet. The copper substrate is then removed by contacting the copper substrate with an iron chloride solution. Exemplary methods for forming the graphene sheet on the support are described in Kim et al., U.S. Published Patent Application No. 2011/0101365, which is incorporated by reference.

As discussed above, the graphene sheet is preferably formed using CVD. Exemplary substrates for the CVD process include copper, $SiO_2$, and nickel. The nature of the substrate for the CVD is not critical since the presence of surface defects on the graphene sheet or the presence of other functional groups on the graphene is the important aspect to solution growth.

Because the micro/nanostructures may be grown in solution (e.g., in either a face-up configuration or face-down), supports having lower or higher densities than the solution may be employed. In one aspect, the support for the graphene is one that has a density and thickness such that it may float on the surface on the solution during the floating growth process. Exemplary materials for the support are typically polymers, and include polyvinylpyrrolidone ("PVP"), polystyrene ("PS"), PMMA, polyimide ("PI") and combinations thereof. The thickness of the support is typically about 100 to 300 nm.

For the flowing growth embodiments, it will be appreciated that the if graphene is attached to a solid substrate like glass, Si, etc. an additional support may be desired to make the assembly float on the top of the solution may be needed.

As used herein, the terms "film" and "sheet" with respect to graphene are used interchangeably herein. The graphene sheets preferably comprise one or two layers of graphene. The graphene sheets, however, may comprise about 1 to 10 layers of graphene (e.g., 1, 2, 3, 4, 5, 6, 7, 8, 9, or 10 layers or some range therebetween). The thickness of the graphene sheet is preferably less than 10 nm (e.g., 10, 9, 8, 7, 6, 5, 4, 3, 2, 1, 0.8, 0.6, 0.4, or 0.2 nm or less or some range therebetween).

The micro/nanostructures grown on the graphene using the growth technique of the present invention may be characterized by their morphology. Exemplary morphologies include, but are not limited to rods, tubes, spheres, wires, needles, belts, flowers, ribbons, cones, pencil tip, dumbbell, dendrites, tubes, etc. The micro/nanostructures may optionally have a hole like structure thereon, for example a rod or wire having a hole at a tip such that it resembles a tube-like structure.

The micro/nanostructures deposited on the graphene sheet have dimensions in the nanometer and micrometer range—typically from about 5 nm to a few hundred microns or longer, typically about 5 nm to 50 µm (e.g., about 20, 25, 30, 35, 40, 45, 50, 80, 100, 200, 300, 400, 500, 600, 700, 800, 900, 1000, 1200, 1400, 1600, 1800, 2000, 2200, 2400, 2600, 2800, 3000, 3200, 3400, 3600, 3800, 4000, 4500, 5000 nm or 10, 15, 20, 25, 30, 35, 40, 45, 50 µm or some range therebetween). In one aspect, the micro/nanostructures are wires and/or rods have a diameter ranging from about 20 to 5000 nm (e.g., about 20, 25, 30, 35, 40, 45, 50, 80, 100, 200, 300, 400, 500, 600, 700, 800, 900, 1000, 1200, 1400, 1600, 1800, 2000, 2200, 2400, 2600, 2800, 3000, 3200, 3400, 3600, 3800, 4000, 4500, 5000, or some range therebetween). The diameter may vary along the length of the rod or wire. The length of the wires or rods typically ranges from about 5 nm to 50 µm (e.g., about 20, 25, 30, 35, 40, 45, 50, 80, 100, 200, 300, 400, 500, 600, 700, 800, 900, 1000, 1200, 1400, 1600, 1800, 2000, 2200, 2400, 2600, 2800, 3000, 3200, 3400, 3600, 3800, 4000, 4500, 5000 nm or 10, 15, 20, 25, 30, 35, 40, 45, 50 µm or some range therebetween). The length is determined by the growth time and may be any value up to a few hundreds of microns or longer (e.g., about 50, 100, 150, 200, 250, 300, 350 m or some range therebetween).

In one aspect, the functional material deposited on the graphene sheet is a metal or metal oxide, preferably a transition metal or transition metal oxide. The functional material may be a semiconducting, dielectric, ferroelectric, metallic material, or any functional material that can form hybrids with graphene for device applications. Non-limiting examples of functional materials include wide bandgap semiconductors such as zinc oxide (ZnO), indium tin oxide (ITO), indium zinc oxide (IZO), aluminum zinc oxide (AZO), amorphous zinc oxide (aZO), cadmium stannate ($Cd_2SnO_4$), tin oxide ($SnO_2$), indium oxide ($In_2O_3$), cadmium tin oxide, fluorinated tin oxide, titanium dioxide ($TiO_2$), visible/infrared bandgap semiconductors including many group II-VI (CdTe, CdS, ZnTe, ZnS and their alloys), group III-V (GaN, InN, etc), and group IV (Si, Ge, etc) and combinations thereof. Thus, the solution for the solution growth may contain one or more of the foregoing metal ions. For example, the solution may comprise zinc ions, indium ions, tin ions, aluminum ions, cadmium ions, titanium ion, or combinations thereof. The metal ions may be introduced into the solution in the form of a metal salt or other complex.

In the aqueous solution, metal cations are formed from a metal salt. The metal cation reacts with hydroxyl groups (—OH) from solution attached to the defects on the graphene (preferably CVD grapheme) to form the semiconductor on graphene. In the exemplary aspect described herein, the zinc cation reacted with $NH_3.H_2O$ and formed $Zn(NH_3)_4^{2+}$, which reacts with the hydroxyl groups (—OH) attached to the defects on the CVD graphene in aqueous solution, leading to the nucleation and growth of ZnO on graphene.

In the present invention, the solution growth may occur over a period of minutes to hours. Typically, growth in solution occurs for about 1 to 30 hours (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 hours or some range therebetween), with typically growth times being up to about 15 hours. The temperature range for the growth is such that the semiconductor remains in solution, and is typically from about 60 to 100° C. (e.g., 60, 70, 80, 90, or 100° C.), with preferred temperatures being about 75 to 85° C.

It is also anticipated that the semiconductor-graphene hybrids made in accordance with the present invention may undergo further annealing in the presence of oxygen.

In many cases, electrical conductivity of the graphene sheet having the semiconductor deposited thereon is substantially the same as the graphene sheet alone. In preferred aspects, the conductivity of the semiconductor-graphene hybrid may be within 10% (e.g., 10, 9, 8, 7, 6, 5, 4, 3, 2, or 1%) of the graphene sheet alone.

In many cases, the transmittance of the semiconductor-graphene hybrids made in accordance with the present invention over the visible spectrum will be above about 50% (e.g., above about 55, 60, 65, 70, 75, 80, or 85%).

The semiconductor-graphene hybrids will now be understood more readily by reference to the following examples, which are provided by way of illustration and are not intended to be limiting.

Example 1

Synthesis of ZnO Graphene Hybrids

Synthesis of controlled aligned orientation of crystalline ZnO micro/nanowire on graphene sheets. FIG. 1 depicts respectively the facing-up in solution and facing-down floating growth processes for synthesis of the hybrid ZnO/graphene nanostructures. Graphene sheets were grown on Cu foils using CVD. PMMA was spin-coated on one side of the as-grown graphene before the sample was immersed into iron chloride solution (0.1 g/mL) for removal of the copper foil. After removing the Cu foil, the graphene sheets were either placed face-down or attached to a substrate for face-up in solution configuration for growth of ZnO micro/nanowires on graphene. For face-down floating growth of ZnO on graphene, the sample of PMMA/graphene floated on the surface of the solution during the entire procedure of the ZnO growth with graphene side facing down since the PMMA/graphene composite sample has a lower density than that of the solution. For face-up in solution, the graphene/PMMA is first transferred to glass or Si substrates and the graphene/PMMA/substrates are placed at the bottom of the solution during the ZnO growth. After the growth of ZnO on graphene by face-down floating, the hybrid ZnO/graphene nanostructures were transferred onto Si or glass substrates for characterization of the physical properties. The target substrate was then immersed in the deionized ("DI") water and alignment of the hybrid ZnO/graphene nanostructures on the substrate was made before the DI water was drained. The sample made by face-up in solution was cleaning with DI water. The samples were then placed in an oven at 80° C. for one hour to eliminate moisture. Finally, the PMMA was removed with acetone.

In order provide a clean graphene/solution interface during solution growth, the sample was treated by 0.1 M HCl solution and washed three times using DI water before PMMA deposition. Clean graphene surface provides a platform for the formation of hybrid semiconductor/graphene nanostructures with well formed interface.

It will be appreciated that in an aqueous solution, $Zn(NO_4)_2$ forms a zinc cation ($Zn^{2+}$). The zinc cation reacts with $NH_3.H_2O$ and formed $Zn(NH_3)_4^{2+}$. Since CVD graphene contains a large number of growth defects, the hydroxyl groups (—OH) from solution can easily attach to the defects on the CVD graphene and reacted with $Zn(NH_3)^{2+}$, leading to the nucleation and growth of ZnO on grapheme without the necessity of seeding.

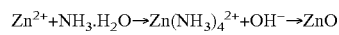

Example 2

Characterization of ZnO Graphene Hybrid Morphology

Figure 2:
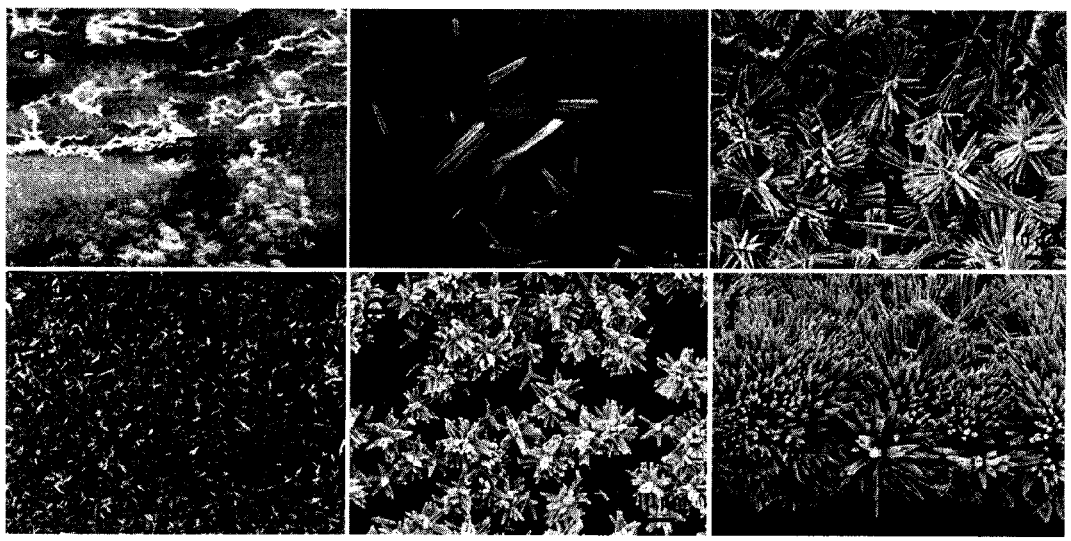
FIG. 2 shows scanning electron micrograph ("SEM") images of the growth of ZnO nanowires on the graphene film for 3, 6, and 12 hours by facing-up in solution process (panels a, b, and c, respectively) and SEM images of the growth of ZnO nanowires on the graphene film for 3, 6, and 12 hours by facing-down floating process (panels d, e, and f, respectively).

FIG. 2 includes the scanning electron microscopy ("SEM") images of representative ZnO/graphene samples grown in solution for 3, 6, and 12 hours, respectively in the face-up (FIG. 2, panels a-c) and face-down floating configurations. After 3 hours solution growth, consideration differences can be observed in the two configurations. In the former, a substantial portion of the graphene surface area was covered with reaction residues or impurities (FIG. 2, panel a), which may prevent nucleation of ZnO directly on graphene. In fact, ZnO crystallites are barely observable in this case. In contrast, dense, uniform ZnO crystalline nanorods (see TEM data later for confirmation of the crystalline structures) were formed on graphene with negligible appearance of impurities in the latter configuration as shown in FIG. 2, panel d. The diameter of the ZnO nanorods is in the range of several to several tens of nanometers. This result suggests ZnO nucleation can occur directly on CVD graphene, which is well known for presence of various growth defects (see Zhang et al. (2011)) may serve as nucleation sites for the hydroxyl groups (—OH) available in solution to attach (see Banhart et al. (2011)). Although earlier work shows direct nucleation of ZnO on CVD graphene can be achieved in CVD growth of ZnO at elevated temperatures above 450° C. (see Lin et al. (2010)), this result demonstrates that the same could be achieved in solution growth at much lower temperatures below 100° C. as long as the graphene/solution interface is maintained clean. This observation is important towards development of low cost process for fabrication of the hybrid nanostructures of ZnO (or other semiconductors) with graphene by eliminating the ZnO seed layer in the solution growth process.

When increasing the growth time to 6 hours, further evolution of the ZnO crystallites is clearly shown in the two configurations. From few sparsely formed ZnO crystallites in the face-up case, ZnO micro/nanowires grew horizontally on the graphene surface as shown in FIG. 2, panel b. In contrast, large numbers of bundles of ZnO micro/nanowires appeared on graphene in the face-down configuration, (see FIG. 2, panel e). At a longer time of 12 hours, some bundles of horizontally aligned ZnO micro/nanowires appeared on the graphene in the face-up configuration, as shown in FIG. 2, panel c, while densely distributed ZnO micro/nanowires aligned vertically can be seen in the face-down case (FIG. 2, panel f). The difference in the orientations of the ZnO micro/nanowires obtained in the two growth configurations may be attributed to the difference in the ZnO nuclei densities in the two cases. The much higher density in the face-down configuration provides lateral physical confinement in a similar fashion to the case of vertically aligned carbon nanotubes (see Liu et al. (2005) and Andrews et al. (1999)), resulting in alignment in the vertical direction. The much lower ZnO nuclei density in the face-up configuration allows ZnO micro/nanowires to grow along the surface of graphene due to the lake of support for the vertical growth, assuming nucleation of ZnO on graphene is not through epitaxy, and the availability of space in proximity of the ZnO nuclei.

Figure 3:
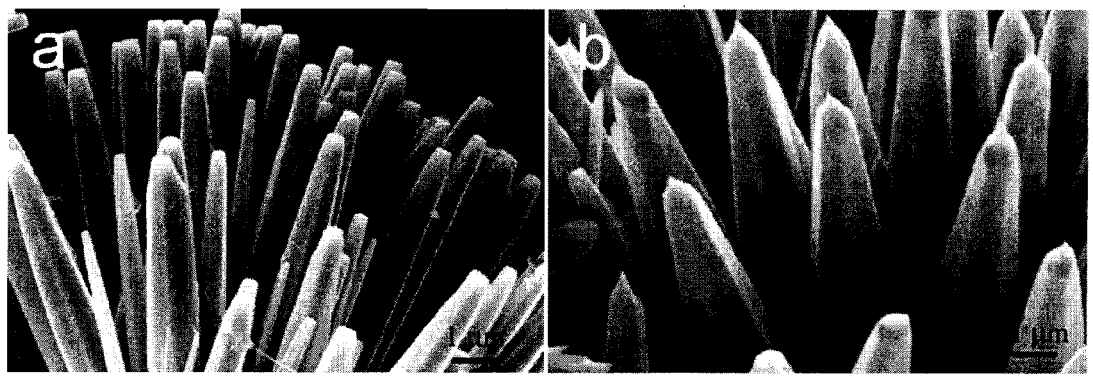
FIG. 3 shows high magnification SEM images of ZnO nanowires grown on graphene films for 12 hours by facing-up in-solution (panel a) and facing-down floating process (panel b).

Panels a and b of FIG. 3 include high-magnification SEM images of ZnO micro/nanowires grown on graphene sheets for 12 hours in the face-up and face-down configurations, respectively. In both cases, the ZnO wires have a hexagonal cross section, which is anticipated for c-axis oriented growth (see Greene et al. (2003)) because of the highest-energy of the lowest-index surfaces of ZnO (see Allan et al. (2005) and Greene et al. (2005)) and suggest the wires are crystalline with wire axis along the ZnO(0001) direction. The taped shape of the ZnO wire stem may be caused by a continuous growth in lateral direction at a slower growth rate in contrast to the faster growth rate in the axial direction of the ZnO nanowires. Some differences are noticeable in terms of morphology of the ZnO micro/nanowires grown in the two configurations. In the face-up case, as shown in panel a FIG. 3, the ZnO wire has a flat end and the diameter is relatively smaller in the range of several hundreds nanometer to 1-2 micrometers. A closer look of the ZnO wires grown in the face-down configuration in panel b of FIG. 3 shows most of them have a pencil shape tip with a larger stem diameter of several micrometer and smaller tip diameter of a few hundreds of nanometers. In addition, ZnO wires were observed grown in the facing-up configuration formed dumbbell structure, as shown in panel c of FIG. 2, with the length of 15 micrometer from center for growth time of 12 hours, which shorter than that of ZnO wires growth in the facing-down around 20 micrometer. In the facing-up configuration, ZnO wires can grow from low density nuclei center on surface along different. However, in the facing-down floating aligned ZnO wires can grow on higher density nuclei due to lateral physical confinement.

Figure 4:
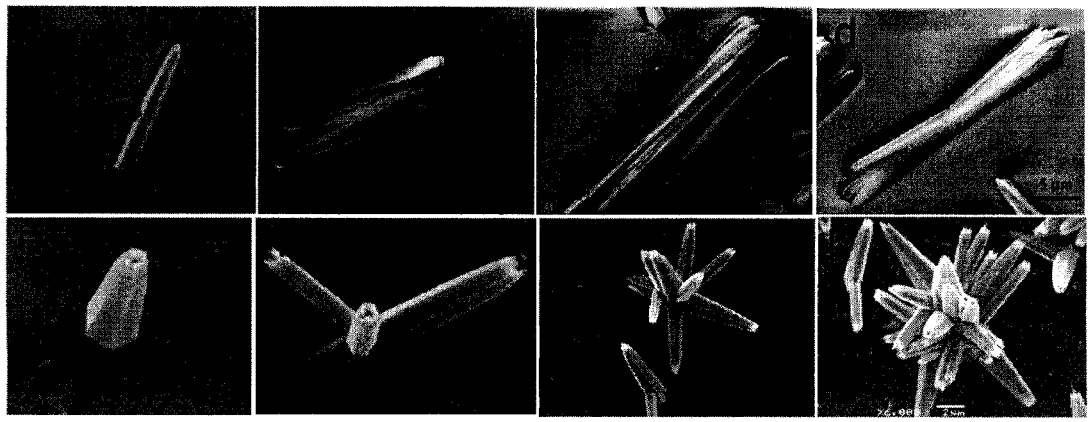
FIG. 4 are typical SEM images of ZnO tubes with various morphologies for growth time of 6 hours by facing-up in solution (panels a, b, c, and d) and typical SEM images of ZnO nanowires with various morphologies for 6 hours by facing-down floating process (panels e, f, g, and h).

Further investigation into the morphologies of ZnO on graphene by facing-up in solution and facing-down floating growth demos led to the discoveries of interesting structure. Using facing-up in solution method, a nanowire horizontally lies on the graphene film (FIG. 4, panel a). Also, bundles of nanowires horizontally grew on the graphene film, as shown in panels b, c, and d of FIG. 4. While using facing-down floating growth, from the SEM image (FIG. 4, panel e), an individual ZnO tube with hexagonal structure grown on graphene films by facing-down floating process for 6 hours was observed. Also, there is a hole structure from the tip. In addition, some tubes with small diameter directly grow on big one to form the branch-like morphologies, as shown in panels f-h of FIG. 4.

Figure 5:
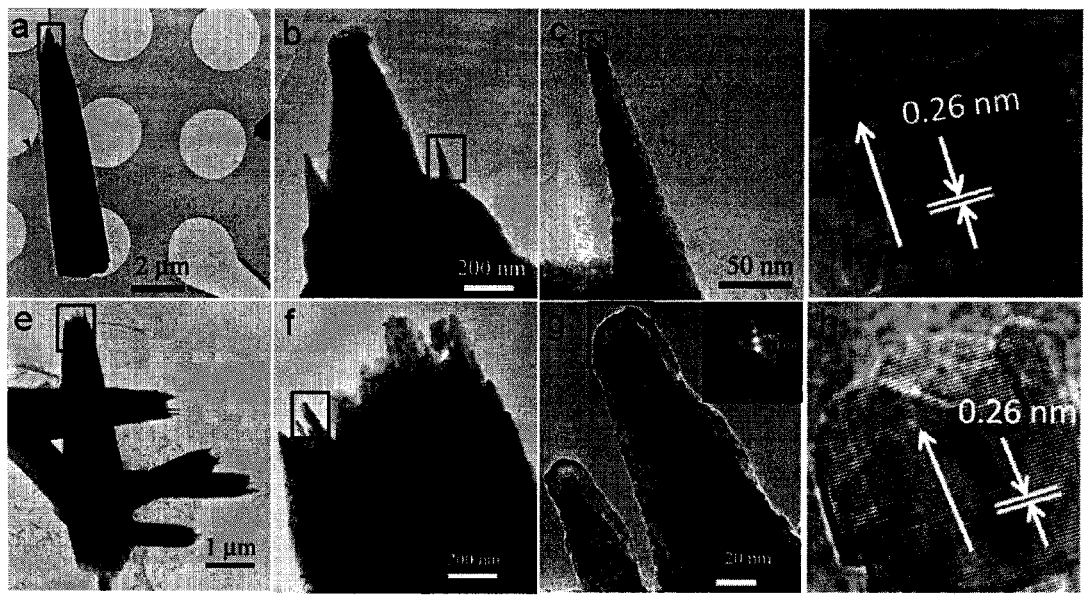
FIG. 5 shows the TEM images of ZnO tubes by facing-up in solution for a growth time of 6 hours (panel a, b, and c) and the TEM images of ZnO wires by facing-down floating for a growth time of 6 hours (panels e, f, and g). The inset in panel g shows the selected area electron diffraction ("SAED") pattern of the ZnO tube. Panels d and h are the high-resolution transmission electron microscopy ("HRTEM") images of tube and wire.
Figure 6:
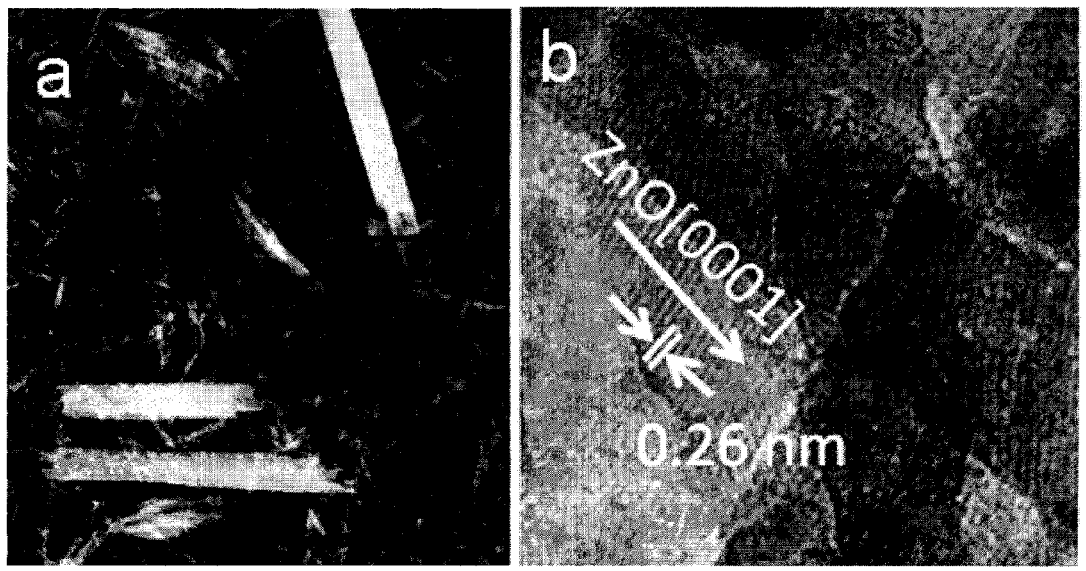
FIG. 6 (panel a) is the transmission electron microscopy ("TEM") image of ZnO tube by self-assembly of nanowires, and HRTEM image (panel b) of ZnO nanowires taken from the square area showing single crystal structure with orientation along ZnO [0001] direction with lattice fringes of 0.26 nm, which self-assemble in the solution and form ZnO tube.

Panels a-c of FIG. 5 represent low magnification TEM images of a typical wire by facing-up in solution method. HRTEM image (FIG. 5, panel d) clearly shows the ZnO (0001) fringes perpendicular to the wire axis are on average separated by 0.26 nm, which indicates the crystalline ZnO wire growth along the ZnO [0001] direction. Panels e-g of FIG. 5 show low magnification TEM images of a typical tube by facing-down floating method. From the images, branch-like structure of cone-like tube with open end were observed. Furthermore, some nanowires around the tubes were observed (FIG. 5, panel e). The SEAD pattern (see inset FIG. 5, panel g) exhibits single crystal structure with orientation along ZnO (0001) direction. A further investigation on the tubular structure by HRTEM (see FIG. 5, panel h) reveals the ZnQ (0001) fringes perpendicular to the wire axis are on average separated by 0.26 nm, indicating the crystalline ZnO tube growth along the ZnO [0001] direction. In addition, TEM images clearly demonstrated that nanowires with the diameter of 10 nm self-assemble the ZnO microtube, as shown in panel a of FIG. 6. The nanowire show single crystal structure with orientation along ZnO (0001) direction with lattice fringes of 0.26 nm (see FIG. 6, panel b). Individual nanowire self-assembles in the solution and form packed nanowires bundles.

Example 3

Crystal Structure of ZnO Graphene Hybrids

Figure 7A:
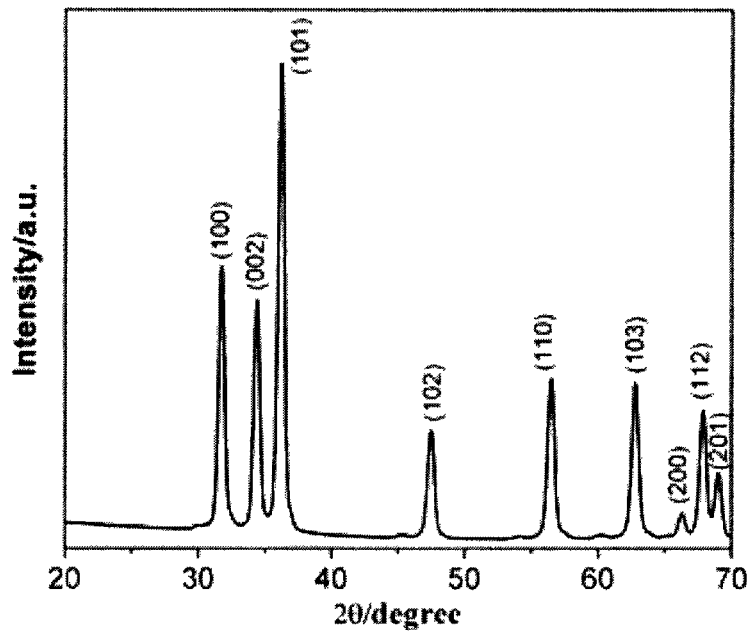
FIG. 7A is the XRD pattern of aligned ZnO micro/nanowires on graphene films.
Figure 7B:
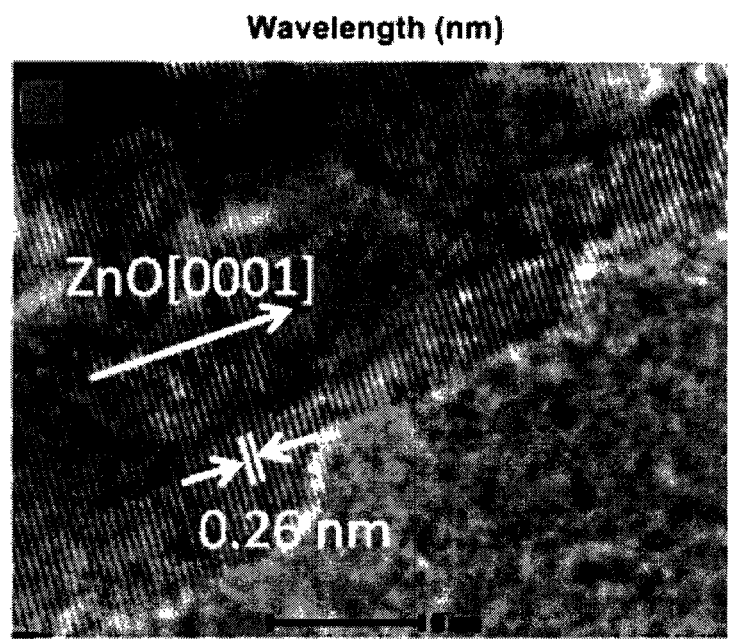
FIG. 7B is the HRTEM image of ZnO micro/nanowire.
Figure 7C:
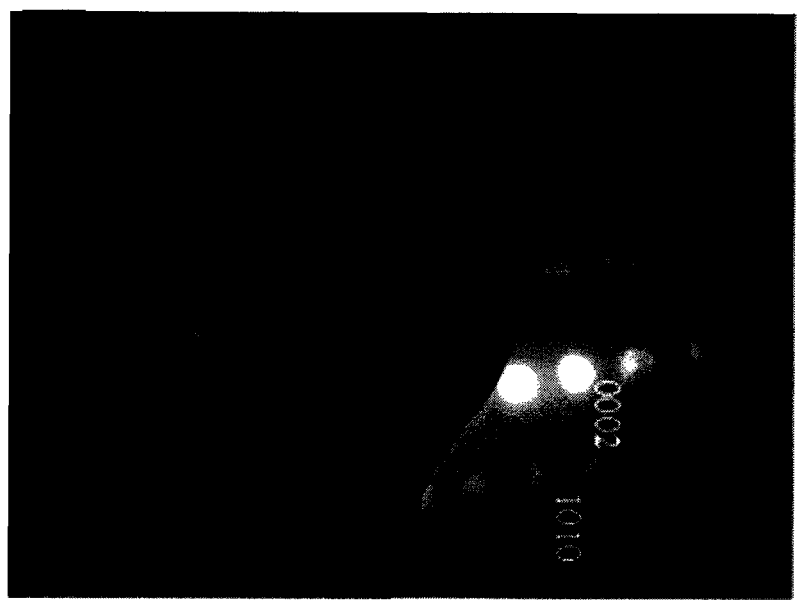
FIG. 7C is the SAED pattern of ZnO micro/nanowire.

The crystal structure of the ZnO micro/nano-wires was characterized using X-ray diffraction ("XRD") (Bruker SMART APEX). FIG. 7A shows the XRD θ-2θ patterns of a ZnO/graphene hybrid sample with 12 hour growth time. The diffraction peaks in FIG. 7A can be indexed to the wurtzite ZnO structure (JCPDS card no. 36-1451) and the lattice constants of this hexagonal phase are $c_0$=5.21 Å and $a_0$=3.25 Å, respectively (see Liu, et al. (2003)) The XRD diffraction peaks of (100), (002), and (101) are the most intensive ones. While (002) peak is expected for the c-axis oriented ZnO nano/micro-rods, the (100) and (101) peaks are also anticipated from the tilted ZnO nanowires as shown in panel f of FIG. 2. A further investigation on the ZnO micro/nano-wire microstructure using high-resolution transmission electron microscopy ("HRTEM") (FIG. 7B) reveals the ZnO(0001) fringes perpendicular to the nanowire axis are on average separated by 0.26 nm, indicating the crystalline ZnO growth along the ZnO [0001] direction. This is consistent to the SEAD pattern taken on the ZnO micro/nano-wire (FIG. 7C), exhibiting single crystal structure with orientation along ZnO [0001] direction. The contour of the ZnO nanowire shows some steps of 1-2 nm in the radial direction, which may be attributed to the slower lateral growth occurring simultaneously with the faster axial growth.

Example 4

Transmittance of ZnO Graphene Hybrids

Figure 7D:
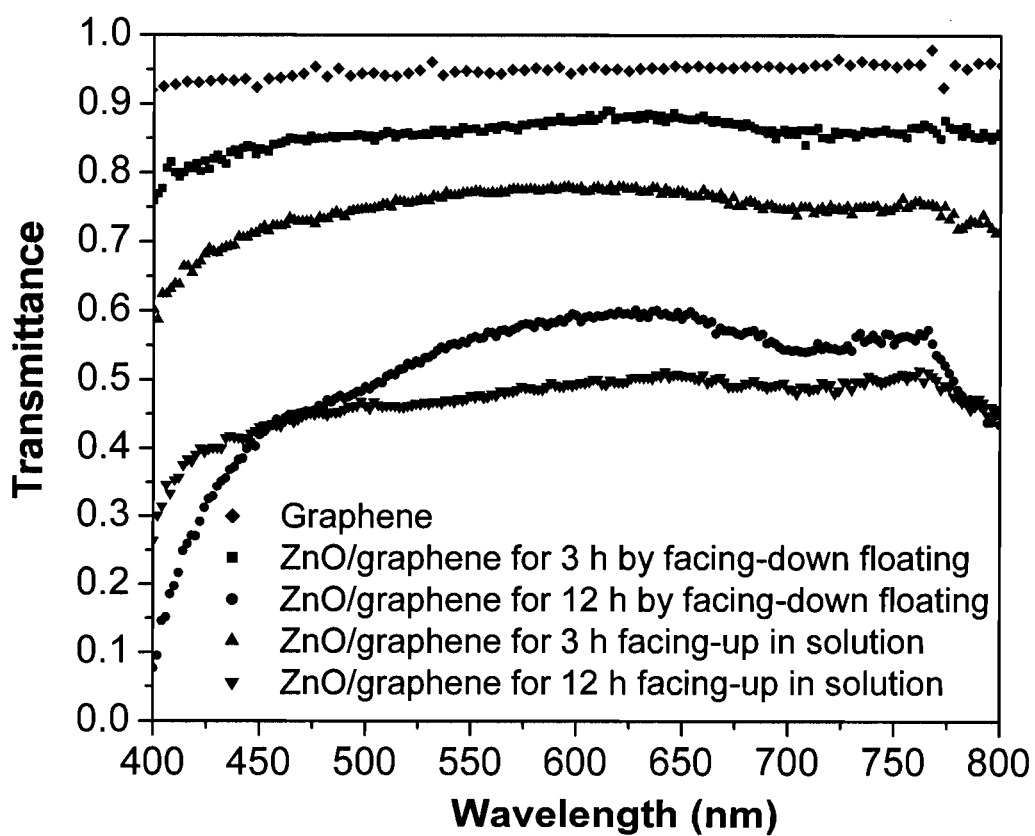
FIG. 7D shows the transmission optical spectra of ZnO growth on graphene films by facing-up in solution method in comparison with those by facing-down floating process.

The optical transmittance and conductivity of ZnO/graphene play a critical role in utilizing such a hybrid structure in optoelectronic devices. FIG. 7D shows the transmittance spectra of the samples of ZnO grown on graphene for 3 hours and 12 hours by facing-up in solution and facing-down floating methods in comparison with graphene as a reference. The ZnO/graphene with ZnO growth time of 3 hours by facing-down floating method shows rather high transmittance over the visible spectrum with relatively flat transmittances ranging from 80% to 86%. However, the ZnO/graphene by facing-up in solution demonstrates lower transmittance ranging from 70% to 75% in comparison with ZnO/graphene by facing-down floating. No uniform ZnO nucleation and aggregation on graphene by facing-up in solution (as shown in panel a of FIG. 2) may result in deceasing transmittance. As the growth time of ZnO increases to 12 hours by facing-down floating, the transmittance decreases considerably to around 55% at wavelengths above about 500 nm. On the other hand, the transmittance of ZnO/graphene for 12 hours by facing-up in solution decreases to around 45% at wavelengths above about 500 nm. The transmittance spectrum of ZnO grown on graphene films by facing-up in solution shows lower transmittance at the same growth time compared with that by facing-down in solution due to the growth orientation of ZnO grown on graphene, as shown in FIG. 2. The aligned structure of ZnO on graphene made from facing-down floating has the advantage of visible transmittance over the samples from facing-up in solution. Furthermore, the transmittance curve shows a strong dip at shorter wavelengths, indicating a much enhanced UV absorption due to ZnO. At the 400 nm wavelength (the lower limit of the instrument), the transmittance is below 10%. It should be noted that the band gap of ZnO is 3.37 eV, which is in the UV range (see Wang et al. (2004)). Hence, the strong UV absorption is anticipated from the ZnO nano/micro-rods. On the other hand, the absorption of the visible light, which increases with ZnO growth time (or ZnO thickness), may be attributed to the presence of oxygen vacancies in the ZnO (see Baruah et al. (2009) and Sheetz et al. (2009)). Although post anneal in oxygen may reduce the oxygen vacancies in ZnO, no annealing was made to the ZnO/graphene hybrid structures in this work to minimize possible oxidation of graphene. It is worth noting that the electrical conductivity of the graphene remained nearly unchanged after the ZnO growth.

Example 5

Electrical Properties of ZnO Graphene Hybrids

Figure 8:
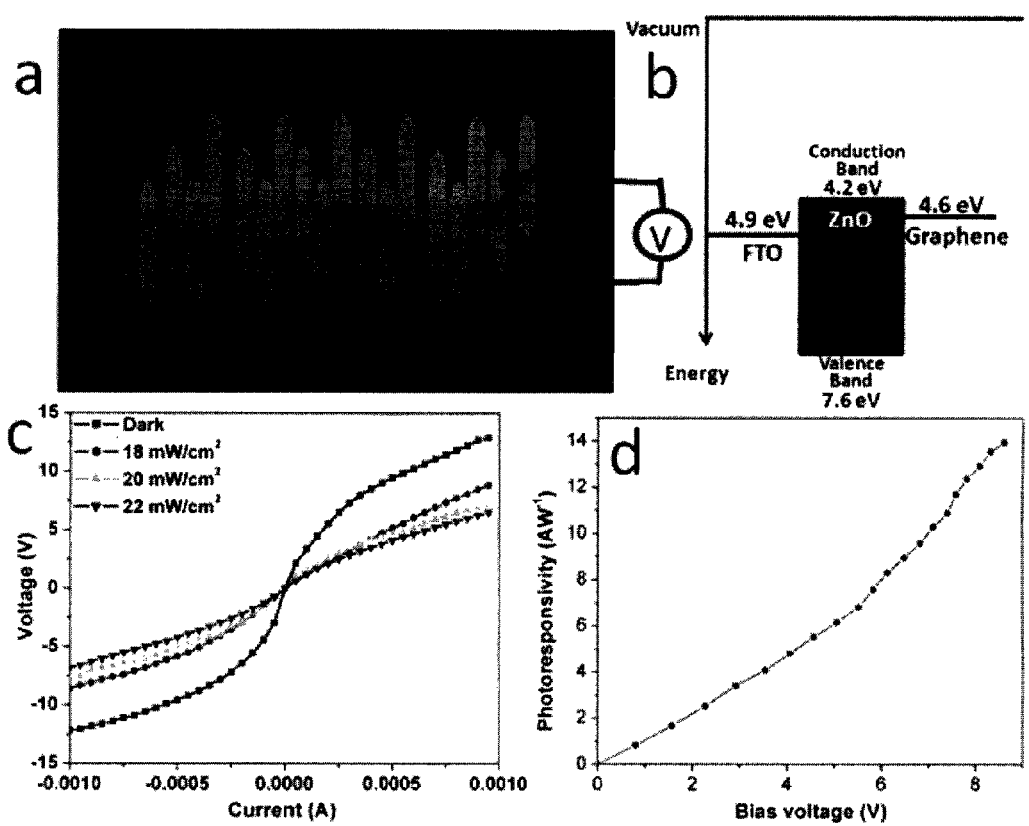
FIG. 8 (panel a) is a schematic representation of the aligned ZnO micro/nanowire/graphene UV detector configuration with a graphene anode (bottom) and an FTO cathode (top).

The graphene used for growth of ZnO micro/nano-wires serves as an electrode readily and current-voltage ("I-V") curves were taken between the graphene and a fluorine doped tin-oxide ("FTO") electrode placed on top of the ZnO micro/nano-wire. Slight pressure was applied to ensure the contact between the ZnO micro/nano-wire and the FTO electrode. Panel a of FIG. 8 depicts the device schematically. Panel b of FIG. 8 shows the energy level diagram of the graphene with the work function of 4.6 eV (see Yu, et al. (2009)), FTO at 4.9 eV, and ZnO with the bandgap of 3.37 eV (see Konenkamp, et al. (2005)). The barrier between the graphene Fermi energy and ZnO conduction band edge is −0.4 eV and the barrier for hole injection from the FTO to the ZnO valence band edge is +2.7 eV. This means graphene will serve as the anode while FTO, as the cathode for photo-generated charge carriers. The nonlinear I-V response for the ZnO nanowires on graphene (see panel c of FIG. 8) reveals the semiconducting characteristic of ZnO. Upon UV illumination, a considerable increase in photoconductivity can be clearly seen (see Liu, et al. (2006)), suggesting a well formed interface between ZnO and graphene for photo-carrier transport. With increasing intensity of UV light in the range of 18 mW/cm$^2$ to 22 mW/cm$^2$ (instrumentation limit), a monotonic increase of the photocurrent was observed. Panel d of FIG. 8 plots the UV photo responsivity against the bias voltage across the graphene anode and FTO cathode. The photo responsivity increases monotonically with the voltage bias almost linearly except the very low limit. At 8.5 V bias, for example, the photocurrent is $6.3 \times 10^{-4}$ A at the UV light intensity of 18 mW/cm$^2$, which yields the photo responsivity around 13.8 A/W or 1.62 A/W per volt for the ZnO nanowire/graphene nanohybrid UV detectors. This value represents about 40% improvement over the best previous report of 22.7 A/W at 20 V bias (or 1.14 A/W per volt) on UV detectors consisting of ZnO nanowires on graphene flakes (see Chang, et al. (2011)) and the improvement is most probably due to the better charge mobility in the CVD graphene as compared to the exfoliated graphene flakes. A recent work by Bai, et al. (2011) reported photoresponse 1.04 A/W per volt on UV detectors constructed on the CVD grown ZnO nanowires transferred to glass or flexible polymer substrates and contacted with Ag electrodes through a standard photolithograph process. For a detector base on pure ZnO nanostructure, the photoresponsivity of 61 A/W at 120 V bias (or 0.51 A/W per volt) was obtained (see Jin, et al. (2008)). The UV detectors made from ZnO/CVD graphene in this work has an advantage of relatively high efficiency under a low driving voltage. The considerably higher photo responsivity in the ZnO micro/nano-wire/graphene nanohybrid UV detectors in this work suggests comparable quality ZnO nanowires can be obtained directly on graphene in the seedless floating solution growth process. In particular, our result suggests graphene electrode is advantageous to high-performance ZnO/graphene hybrid UV detector applications. A better performance is anticipated through optimization of processing conditions and the device configurations.

Figure 10:
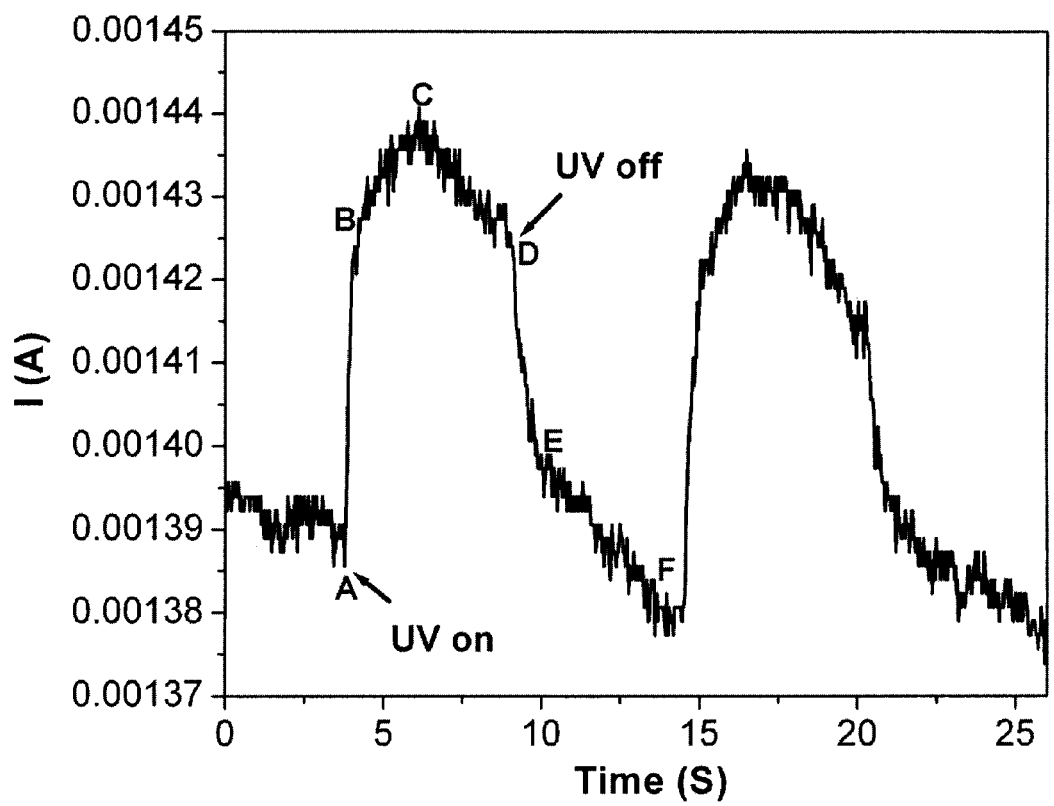
FIG. 10 is the temporal photocurrent response of the UV detector constructed using aligned ZnO micro/nanowires on the CVD graphene film to UV light ON-OFF cycles at: A—UV on, B—90% of the photocurrent saturation value, C—the photocurrent saturation value, D—UV off, E—the shift point of from quick drop to slow decay, F—background current immediately before UV light was on again.

It should be noted that the UV photoresponse of the previously reported ZnO micro/nano-wire on graphene flakes UV detectors is spontaneous but followed with a gradual increase of the photocurrent over a period of several hundred seconds (see Liu, et al. (2006)). More recently, Wang et al. (2012) observed the enhancement in on/off ratio and photoresponse current by introducing an appropriate weight of reduced graphene oxide into hydrangea-like ZnO film (see Wang, et al. (2012)). While other mechanisms may contribute to the slow response, the flake structure of graphene and the uncontrollable interface between ZnO nanowires and graphene may present a primary obstacle for charge carrier transfer from ZnO to graphene and transport through graphene to electrode. In addition, charge traps associated directly to the defects in the ZnO nanowires may not be ruled out completely. In contrast, a much faster UV photo response was observed in the ZnO nanowires on CVD graphene nanohybrids fabricated in the seedless floating process developed in this work. As illustrated in FIG. 10, the photocurrent responds to the "on" and "off" of the UV light in a fairly instantaneously manner. The detector response time defined as the time for the current to rise from 10% to 90% of saturation value (point A to B) is 0.3 seconds, which is several orders of magnitude shorter than that in the ZnO nanowire/graphene flake UV detectors, suggesting the dominant mechanism responsible for the slow response in the previous work (see Chang, et al. (2011)) may arise from the hindered charge transport from ZnO to graphene flakes and through graphene flakes. This argument is supported by comparable time constants (rising time about 1 second and recovering time 3 seconds) of individual ZnO nanowire UV detectors (see Das, et al. (2010)) to those on the ZnO nanowires/CVD graphene nanohybrid reported here, indicating the ZnO/graphene interface and CVD graphene do not present any considerable obstacles to the charge transport. Nevertheless, some undesirable features are clearly seen in the dynamic photoresponse in FIG. 10. For example, the top part of the photoresponse (from B to C and then to D) is rounded instead of squared, suggesting a slower process co-exists with the faster UV response. When turning off the UV light at point D, the photocurrent quickly drops (point D to E) in about 2.5 seconds, which is followed with a slower decay (E to F) in 4 seconds. The asymmetric faster rise and slower fall of the photocurrent in response to the UV light "on" and "off", respectively, suggest some charge traps in ZnO possibly due to existence of oxygen vacancies, oxygen absorption on ZnO surfaces, and other defects (see Soci, et al. (2007)). When UV light shines on ZnO nanowires, electron-hole pairs are generated in the ZnO nanowires. Some holes migrate to the surface and neutralize the adsorbed oxygen ions leaving behind unpaired electrons, resulting in band bending and the conductivity of the ZnO increasing (see Das, et al. (2010)). A similar trend was also observed on $TiO_2$/carbon nanofiber due to localized defect states within the bandgap and hence hole trapping in the TiO2 shell (see Rochford, et al. (2010).).

Figure 9:
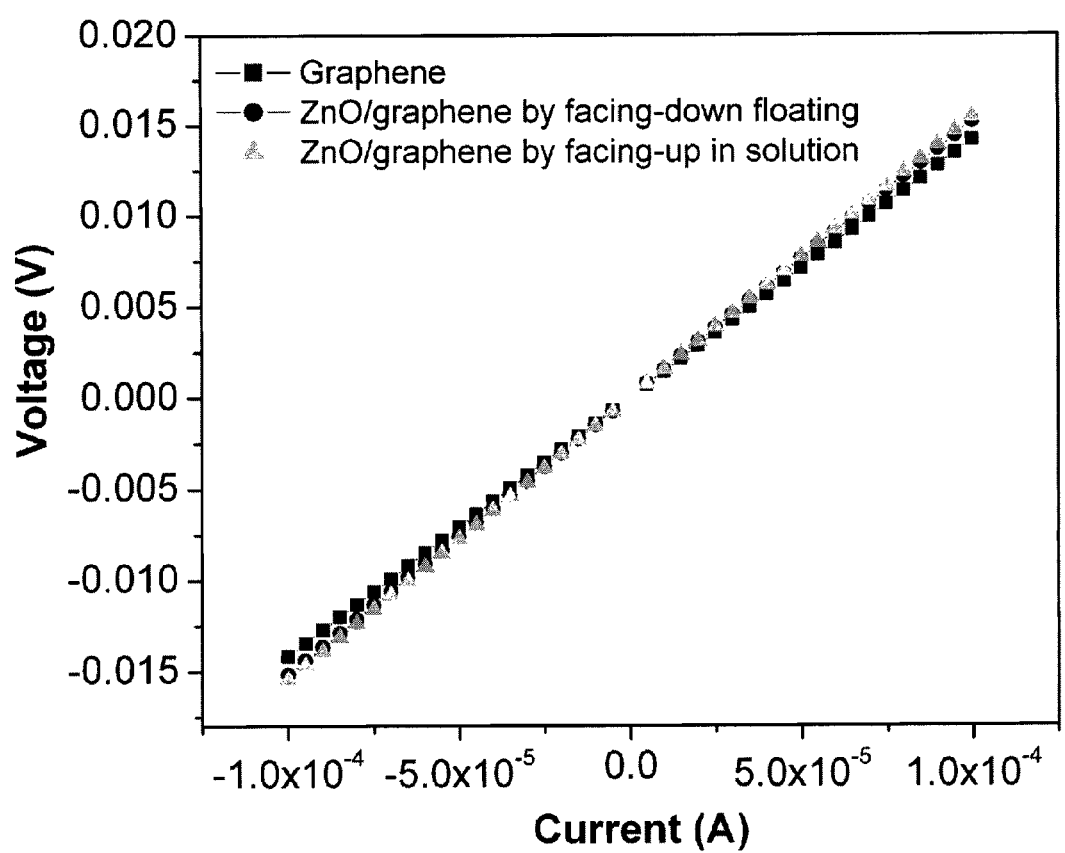
FIG. 9 shows the I-V curves of CVD graphene, and ZnO growth on graphene by the facing-up in solution and the facing-down floating process.

FIG. 9 compares the I-V curves for CVD graphene, ZnO growth on graphene in the facing-up and the facing-down configurations. The slightly decreased electrical conductivity is observed for both types of hybrid samples in comparison with that of CVD graphene. The conductivities of ZnO/graphene samples by facing-down floating and facing-up in solution decreased by 7%, and 9%, respectively, comparing to that of CVD graphene. The observed little change of conductivity for three types of samples could be due to a low reaction temperature below 100° C., which does not influence the stability of CVD graphene.

Figure 11:
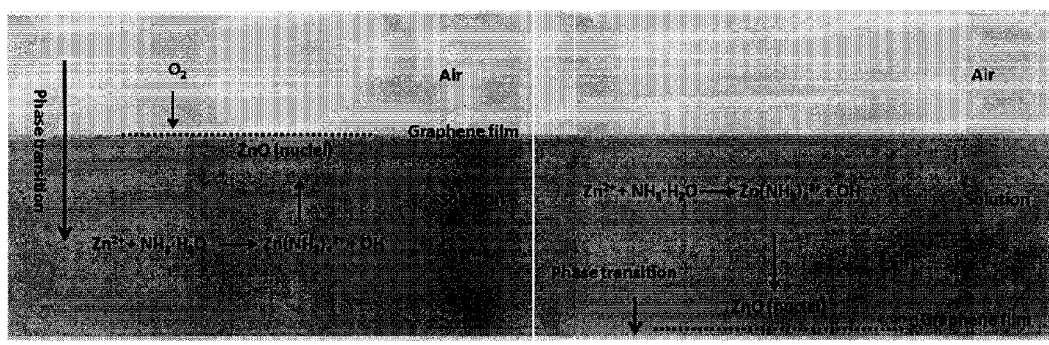
FIG. 11 is a scheme of the proposed growth mechanism of the seedless facing-up in the solution and facing-down floating growth of ZnO on a graphene

According to the experimental results, FIG. 11 summarizes a proposed facing-down floating and facing-up in solution growth of mechanism of self-assembly of nanowires to microtubes or microwires. Two processes dominated the growth of nanocrystal via a solution route including the diffusion process of the reactants to the surface of the growing crystallite and the reaction at the surface of the crystallite to incorporate the reactant as a part of the growth process (see Viswanatha et al. (2007)). Since CVD graphene contains a large number of growth defects, the hydroxyl groups (—OH) from solution can easily attach to the defects on the CVD graphene and reacted with zinc ion, leading to the nucleation and growth of ZnO on graphene. Although a spontaneous c-axis preferred growth orientation of wurtzite ZnO dominated due to the [0001] basal plane with higher surface energy, the difference in the initial nucleation process can affect the subsequent ZnO growth regime (see Shinagawa et al. (2009)). Furthermore, oxygen concentration in solution plays an important role in the nucleation process which affects the subsequent crystal growth regime including crystallinity, orientation, and surface morphology (see Shinagawa et al. (2009)). Oxygen concentration on the surface of solution is higher than that in solution leading to rapid nucleation (as shown in panel d of FIG. 2) of ZnO using facing-down floating. For facing-up in solution, low concentration of oxygen may results in the slow nucleation of ZnO, as presented in panel a of FIG. 2. Once nucleated, nanowire grew away from the nucleating center. The growth rate of nanowires outside bundles is faster than these inside bundles due to larger exposure surface in the solution. The microtube can be formed with growth time increasing. Some nanowires are not parallel growth on the central bundle to form the branch-like structure. The ZnO bundles aligned on the graphene films with increasing growth time due to limitation of space using facing-down floating, as shown in panel f of FIG. 2. However, using facing-up in solution method, no uniformed nuclei formed on graphene film provided space for horizontal growth of ZnO nanowires, as shown in panel d of FIG. 2. The differences of initial nucleation of ZnO on graphene may attribute to different orientation of ZnO micro/nano rod array via facing-down floating and facing-up in solution. Therefore, the orientation of ZnO nanowire on graphene film can be controlled by locating graphene films in different position of solution.

In sum, a seedless solution process for tailoring aligned orientation of crystalline ZnO micro/nanowire on graphene sheets by facing-down floating or facing-up in the $Zn(NO_4)_2$ solution was investigated. By simply tuning the location of graphene film in solution, the aligned orientation of ZnO micro/nanowire on graphene sheets can be controlled from verticality to horizontality. An analysis of SEM images from various growth periods indicates alterable aligned orientation due to different density and coverage of ZnO nucleation at the beginning of chemical reaction. Furthermore, the grow mechanism of self-assembly of nanowires was proposed to explain the formation of ZnO nano/microwires on graphene. The experimental method presented here are not limited to aligned orientation of ZnO micro/nanowire but pave the way for fabrication of other semiconductive materials with desirable orientation on large-scale flexible CVD graphene film at low temperature for application of photovoltaic, photocatalysis, biosensors, and other optoelectronic devices.

All publications and patent applications mentioned in this specification are herein incorporated by reference to the same extent as if each individual publication or patent application was specifically and individually indicated to be incorporated by reference.

Allan et al., *Growth of ZnO thin films—experiment and theory*, Journal of Materials Chemistry 15(1) 139-148 (2005).

Andrews et al., *Continuous production of aligned carbon nanotubes: a step closer to commercial realization*, Chemical Physics Letters 303(5-6) 467-474 (1999).

Bai et al., *Graphene nanomesh*, Nature Nanotechnology 5(3) 190-194 (2010).

Bai, et al., *High-Performance Integrated ZnO Nanowire UV Sensors on Rigid and Flexible Substrates*, Adv. Funct. Mater. 21 4464-4469 (2011).

Banhart et al., *Structural Defects in Graphene*, Acs Nano 5(1) 26-41 (2011).

Baruah et al., *Photoreactivity of ZnO nanoparticles in visible light: Effect of surface states on electron transfer reaction*, Journal of Applied Physics 105(7) (2009).

Chang, et al., *A Highly Sensitive Ultraviolet Sensor Based on a Facile in situ Solution-grown ZnO Nanorod/Graphene Heterostructure*, Nanoscale 3 258-264 (2011).

Chen et al., *Energy Transfer from Individual Semiconductor Nanocrystals to Graphene*, Acs Nano 4(5) 2964-2968 (2010).

Chung et al., *Transferable GaN Layers Grown on ZnO-Coated Graphene Layers for Optoelectronic Devices*, Science 330(6004) 655-657 (2010).
Claeyssens, *Growth of ZnO thin films—experiment and theory*, J Mater Chem 15 139-148 (2005).
Das, et al., *ZnO single nanowire-based UV detectors*, Appl Phys Lett 97 022103 (2010).
Geim et al., *The rise of graphene*, Nature Materials 6(3) 183-191 (2007).
Greene et al., *Low-temperature wafer-scale production of ZnO nanowire arrays*, Angewandte Chemie-International Edition 42(26) 3031-3034 (2003).
Greene, et al., *General Route to Vertical ZnO Nanowire Arrays Using Textured ZnO Seeds*, Nano Lett 5 1231-1236 (2005).
Han et al., *Energy band-gap engineering of graphene nanoribbons*, Physical Review Letters 98(20) (2007).
Hwang et al., *Plasmon-Enhanced Ultraviolet Photoluminescence from Hybrid Structures of Graphene/ZnO Films*, Physical Review Letters 105(12) 127403 (2010).
Jin, et al., *Solution processed ultraviolet photodetectors based on colloidal ZnO nanoparticles*, Nano Lett 8 1649-1653 (2008).
Kamat, *Graphene-Based Nanoassemblies for Energy Conversion*, Journal of Physical Chemistry Letters 2(3) 242-251 (2011).
Kim et al., *Vertical ZnO nanowires/graphene hybrids for transparent and flexible field emission*, Journal of Materials Chemistry 21(10) 3432-3437 (2011).
Kim et al., *Electronic device including graphene thin film and methods of fabricating the same*, U.S. Published Patent Application No. 2011/0101365.
Konenkamp, et al., *Ultraviolet electroluminescence from ZnO/polymer heterojunction light-emitting diodes*, Nano Lett 5 2005-2008 (2005).
Kumar et al., *Controlled Growth of Semiconducting Nanowire, Nanowall, and Hybrid Nanostructures on Graphene for Piezoelectric Nanogenerators*, Acs Nano 5(5) 4197-4204 (2011).
Lee, et al., *ZnO Nanorod-Graphene Hybrid Architectures for Multifunctional Conductors*, J Phys Chem C 113 19134-19138 (2009).
Li et al., *Large-Area Synthesis of High-Quality and Uniform Graphene Films on Copper Foils*, Science 324 1312-1314 (2009).
Liang et al., *TiO(2) Nanocrystals Grown on Graphene as Advanced Photocatalytic Hybrid Materials*, Nano Research 3(10) 701-705 (2010).
Lin et al., *Heterogeneous Graphene Nanostructures: ZnO Nanostructures Grown on Large-Area Graphene Layers*, Small 6(21) 2448-2452 (2010).
Liu, et al., *Hydrothermal Synthesis of ZnO Nanorods in the Diameter Regime of 50 nm*, J Am Chem Soc 125 4430-4431 (2003).
Liu et al., *Controlled syntheses of aligned multi-walled carbon nanotubes: Catalyst particle size and density control via layer-by-layer assembling*, Chemistry of Materials 17(26) 6599-6604 (2005).
Liu, et al., *Water-Assisted Growth of Aligned Carbon Nanotube—ZnO Heterojunction Arrays*, Adv Mater 18 1740-+ (2006).
Liu et al., *Doped graphene nanohole arrays for flexible transparent conductors*, Applied Physics Letters 99(2) 023111 (2011).
Liu, et al., *Triangular Graphene Grain Growth on Cube-Textured Cu Substrates*, Adv. Funct. Mater. 21 3868-3874 (2011).
Novoselov et al., *Electric field effect in atomically thin carbon films*, Science 306(5296) 666-669 (2004).
Novoselov et al., *Two-dimensional gas of massless Dirac fermions in graphene*, Nature 438 197-200 (2005).
Park et al., *ZnO Nanorod-Graphene Hybrid Architectures for Multifunctional Conductors*, Journal of Physical Chemistry C 113(44) 19134-19138 (2009).
Rochford, et al., *The effect of annealing on the photoconductivity of carbon nanofiber/TiO2 core-shell nanowires for use in dye-sensitized solar cells*, Appl Phys Lett 97 (2010).
Sheetz, et al., *Defect-induced optical absorption in the visible range in ZnO nanowires*, Phys Rev B 80 195314 (2009).
Shinagawa et al., *Effects of Counteranions and Dissolved Oxygen on Chemical ZnO Deposition from Aqueous Solutions*, Journal of the Electrochemical Society 156(5) H320-H326 (2009).
Soci, et al., *ZnO Nanowire UV Photodetectors with High Internal Gain*, Nano Lett 7 1003-1009 (2007).
Todd et al., *Quantum Dot Behavior in Graphene Nanoconstrictions*, Nano Letters 9(1) 416-421 (2009).
Vayssieres, *Growth of arrayed nanorods and nanowires of ZnO from aqueous solutions*, Advanced Materials 15(5) 464-466 (2003).
Viswanatha et al., *Growth mechanism of nanocrystals in solution: ZnO, a case study*, Physical Review Letters 98(25) (2007).
Wang et al., *Large-scale hexagonal-patterned growth of aligned ZnO nanorods for nano-optoelectronics and nanosensor arrays*, Nano Letters 4(3) 423-426 (2004).
Wang, *Zinc oxide nanostructures: growth, properties and applications*, J. Phys.: Condens. Matter 16 R829-R858 (2004).
Wang, et al., *A flexible UV nanosensor based on reduced graphene oxide decorated ZnO nanostructures*, Nanoscale 4 2678-2684 (2012).
Xu, et al., *Patterned growth of vertically aligned ZnO nanowire arrays on inorganic substrates at low temperature without catalyst*, J Am Chem Soc 130 14958-14959 (2008).
Yang et al., *Solution-grown zinc oxide nanowires*, Inorganic Chemistry 45(19) 7535-7543 (2006).
Yang et al., *Fabrication and characterization of graphene oxide/zinc oxide nanorods hybrid*, Applied Surface Science 257(21) 8950-8954 (2011).
Yi et al., *Vertically aligned ZnO nanorods and graphene hybrid architectures for high-sensitive flexible gas sensors*, Sensors and Actuators B-Chemical 155(1) 264-269 (2011).
Yu, et al., *Tuning the Graphene Work Function by Electric Field Effect*, Nano Lett 9, 3430-3434 (2009).
Yun, et al., *Effect of quench on the crystallinity and alignment of Boron nanowires*, Appl. Phys. Lett. 84 2892-2894 (2004).
Zhang et al., *Defect-like Structures of Graphene on Copper Foils for Strain Relief Investigated by High-Resolution Scanning Tunneling Microscopy*, Acs Nano 5(5) 4014-4022 (2011).
Zhou et al., *Hydrothermal preparation of ZnO-reduced graphene oxide hybrid with high performance in photocatalytic degradation*, Applied Surface Science 258(17) 6204-6211 (2012).

From the foregoing it will be seen that this invention is one well adapted to attain all ends and objectives herein-above set forth, together with the other advantages which are obvious and which are inherent to the invention. Since many possible embodiments may be made of the invention without departing from the scope thereof, it is to be understood that all matters herein set forth or shown in the accompanying drawings are to be interpreted as illustrative, and not in a limiting sense. While specific embodiments have been shown and discussed, various modifications may of course be made, and the invention is not limited to the specific forms or arrangement of parts and steps described herein, except insofar as such limitations are included in the following claims. Further, it will be understood that certain features and subcombinations are of utility and may be employed without reference to other features and subcombinations. This is contemplated by and is within the scope of the claims.

What is claimed and desired to be secured by Letters Patent is as follows:

1. A seedless method for forming a semiconductor-graphene hybrid:
   forming a graphene sheet on a support to form a supported graphene sheet having a graphene face;
   exposing said supported graphene sheet to a solution comprising a semiconductor metal ion at a temperature below 100° C. and under ambient air pressure for a time so that said semiconductor grows on said graphene sheet, and wherein said exposing occurs without seeding said graphene sheet.

2. The method of claim 1 wherein said exposing step comprises orienting said supported graphene sheet face-up in said solution.

3. The method of claim 1 wherein said exposing step comprises orienting said supported graphene sheet face-down in said solution.

4. The method of claim 1 wherein said exposing step comprises floating said supported graphene sheet on the surface of said solution comprising said semiconductor metal ion, wherein said graphene face is facing down so that said semiconductor grows on said face of said graphene sheet.

5. The method of claim 1 wherein said forming step comprises growing a graphene sheet on a substrate using chemical vapor deposition; spin-coating said support onto said graphene sheet; and removing said substrate.

6. The method of claim 1 wherein said forming step comprise the steps of growing a graphene sheet on a copper or nickel substrate using chemical vapor deposition; spin-coating a polymethylmethacrylate, polyvinylpyrrolidone, or polystyrene support onto said graphene sheet; and removing said copper or nickel substrate.

7. The method of claim 1 wherein said graphene sheet comprises one to two layers of graphene.

8. The method of claim 1 wherein said semiconductor comprises a metal oxide grown on said graphene sheet.

9. The method of claim 1 wherein said semiconductor forms nanostructures or microstructures comprising rods on said graphene sheet.

10. A seedless method for forming a semiconductor-graphene hybrid:
    forming a graphene sheet on a support to form a supported graphene sheet having a graphene face;
    exposing said supported graphene sheet to a solution comprising a semiconductor metal ion at a temperature below 100° C. for a time so that said semiconductor grows on said graphene sheet, and wherein said exposing occurs without seeding said graphene sheet, and
    wherein said semiconductor forms nanostructures or microstructures comprising rods on said graphene sheet, and
    wherein said exposing step comprises orienting said supported graphene sheet face-up in said solution, wherein said rods are generally horizontally aligned on said graphene.

11. The method of claim 9 wherein said exposing step comprises floating said supported graphene sheet on the surface of said solution comprising said semiconductor metal ion such that said graphene face is facing down in solution, and wherein said rods are generally vertically aligned on said graphene.

12. The method of claim 9 wherein said rods have a hexagonal cross section.

13. The method of claim 1 wherein said semiconductor comprises zinc oxide, copper oxide or combinations thereof.

14. The method of claim 1 wherein said solution has a pH of about 8 to 11.

15. The method of claim 1 wherein said solution comprises zinc ions, and said semiconductor-graphene hybrid comprises a graphene sheet having zinc oxide nanorods and/or microrods.

16. The method of claim 1 wherein said exposing occurs for about 1 to 15 hours.

17. The method of claim 1 wherein said exposing occurs at a temperature of about 60 to 100° C.

18. The method of claim 1 wherein said support comprises polymethylmethacrylate, polyvinylpyrrolidone, polystyrene, or combinations thereof.

19. A seedless method for forming a semiconductor-graphene hybrid:
    forming a graphene sheet on a support to form a supported graphene sheet having a graphene face;
    exposing said supported graphene sheet to a solution comprising a semiconductor metal ion at a temperature below 100° C. for a time so that said semiconductor grows on said graphene sheet, and wherein said exposing occurs without seeding said graphene sheet, and wherein said exposing step comprises orienting said supported graphene sheet in a first orientation for a first period of time and then orienting said supported graphene sheet in a second configuration for a second period of time.

20. The method of claim 1 wherein said exposing step comprises exposing said supported graphene sheet to an aqueous solution comprising semiconductor metal cations, and wherein said metal cations react with hydroxyl groups from solution which are attached to surface defects on said supported graphene sheet.

21. The method of claim 20 wherein said supported graphene sheet is floated on the surface of said aqueous solution comprising said semiconductor metal cations.

22. The method of claim 1 wherein said method results in a semiconductor-graphene hybrid having an electrical conductivity that is substantially the same as said graphene sheet alone.

23. A semiconductor-graphene hybrid prepared by the method comprising:
    forming a graphene sheet on a support to form a supported graphene sheet having a graphene face:
    exposing said supported graphene sheet to a solution comprising a semiconductor metal ion at a temperature below 100° C. and under ambient air pressure for a time so that said semiconductor grows on said graphene sheet, and wherein said exposing occurs without seeding said graphene sheet.

24. A seedless method for forming a semiconductor-graphene hybrid comprising exposing a supported graphene sheet to an aqueous basic solution comprising transition metal ions at a temperature below 100° C. and under ambient pressure for a time to provide a semiconductor comprising an oxide of the transition metal ions grown on said graphene sheet, and wherein said exposing occurs without seeding said graphene sheet.

* * * * *

UNITED STATES PATENT AND TRADEMARK OFFICE
CERTIFICATE OF CORRECTION

PATENT NO. : 8,878,157 B2
APPLICATION NO. : 13/655656
DATED : November 4, 2014
INVENTOR(S) : Judy Z. Wu et al.

Page 1 of 1

It is certified that error appears in the above-identified patent and that said Letters Patent is hereby corrected as shown below:

In the Specification

Column 1, Lines 14-19:
Delete the phrase:
"The present invention was sponsored by the U.S. Army Research Office Contract No. ARO-W911 NF-09-1-0295 and W911 NF-12-1-0412, and National Science Foundation Contracts Nos. NSF-DMR-0803149, 1105986, and EPSCoR 0903806, and the government may have certain rights in the invention."

And replace with:
--This invention was made with government support under 1105986, 0903806, and 0803149 awarded by the National Science Foundation, and W911NF-09-1-0295 and W911NF-12-1-0412 awarded by the Army Research Office. The government has certain rights in the invention.--.

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*